US010654712B2

(12) United States Patent
Albers et al.

(10) Patent No.: US 10,654,712 B2
(45) Date of Patent: May 19, 2020

(54) ELEVATED MEMS DEVICE IN A MICROPHONE WITH INGRESS PROTECTION

(71) Applicant: Knowles Electronics, LLC, Itasca, IL (US)

(72) Inventors: John J. Albers, Itasca, IL (US); Brandon Harrington, Itasca, IL (US); Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 16/137,206

(22) Filed: Sep. 20, 2018

(65) Prior Publication Data
US 2019/0084828 A1    Mar. 21, 2019

Related U.S. Application Data

(60) Provisional application No. 62/561,653, filed on Sep. 21, 2017.

(51) Int. Cl.
*B81B 7/02*   (2006.01)
*H04R 19/04*  (2006.01)
(Continued)

(52) U.S. Cl.
CPC ............ *B81B 7/02* (2013.01); *B81C 1/00158* (2013.01); *H04R 1/086* (2013.01); *H04R 19/005* (2013.01);
(Continued)

(58) Field of Classification Search
CPC .............. B81B 7/02; B81B 2203/0127; B81B 2203/0315; B81B 2207/115;
(Continued)

(56) References Cited

U.S. PATENT DOCUMENTS

| 7,190,038 B2 | 3/2007 | Dehe et al. |
| 7,473,572 B2 | 1/2009 | Dehe et al. |

(Continued)

FOREIGN PATENT DOCUMENTS

| EP | 3 065 416 A1 | 9/2016 |
| WO | WO-2017/012122 A | 1/2017 |

OTHER PUBLICATIONS

International Search Report and Written Opinion, PCT/US2018/052030, 11 pages (dated Dec. 14, 2018).

*Primary Examiner* — Oyesola C Ojo
(74) *Attorney, Agent, or Firm* — Foley & Lardner LLP (57) ABSTRACT

A micro electro mechanical system (MEMS) microphone includes a base including a port extending through the base, a shim assembly, an ingress protection element, and a MEMS device. The shim assembly is disposed on the base and over the port. The shim assembly has a plurality of walls that form a hollow interior cavity. The shim assembly also has a top surface and a bottom surface coupled to the base. The ingress protection element extends over and is coupled to the top of the shim assembly to enclose the cavity of the shim assembly. The shim assembly elevates the ingress protection element above the base and is effective to prevent the passage of contaminants there through. The MEMS device includes a diaphragm and a back plate and is disposed over the ingress protection element.

20 Claims, 9 Drawing Sheets

(51) Int. Cl.
   *H04R 19/00* (2006.01)
   *B81C 1/00* (2006.01)
   *H04R 1/08* (2006.01)
(52) U.S. Cl.
   CPC ...... *H04R 19/04* (2013.01); *B81B 2201/0257* (2013.01); *B81B 2203/0127* (2013.01); *B81B 2203/0315* (2013.01); *B81B 2207/115* (2013.01); *B81C 2201/053* (2013.01); *H04R 2201/003* (2013.01)
(58) Field of Classification Search
   CPC ............ B81B 2201/0257; H04R 19/04; H04R 19/005; H04R 2201/003; H04R 1/086; B81C 1/00158; B81C 2201/053
   See application file for complete search history.

(56) References Cited

U.S. PATENT DOCUMENTS

| | | | |
|---|---|---|---|
| 7,781,249 | B2 | 8/2010 | Laming et al. |
| 7,795,695 | B2 | 9/2010 | Weigold et al. |
| 7,825,484 | B2 | 11/2010 | Martin et al. |
| 7,829,961 | B2 | 11/2010 | Hsiao |
| 7,856,804 | B2 | 12/2010 | Laming et al. |
| 7,903,831 | B2 | 3/2011 | Song |
| 9,278,849 | B2 * | 3/2016 | Underbrink ........... B81B 7/0006 |
| 9,769,554 | B2 * | 9/2017 | Brioschi ............... B81B 7/0061 |
| 10,154,328 | B2 * | 12/2018 | Watson .................. H04R 1/023 |
| 10,167,188 | B2 | 1/2019 | Agashe et al. |
| 2005/0186703 | A1 * | 8/2005 | Weiblen ................ B81B 7/0051 438/106 |
| 2005/0207605 | A1 | 9/2005 | Dehe et al. |
| 2007/0278501 | A1 | 12/2007 | MacPherson et al. |
| 2008/0175425 | A1 | 7/2008 | Roberts et al. |
| 2008/0267431 | A1 | 10/2008 | Leidl et al. |
| 2008/0279407 | A1 | 11/2008 | Pahl |
| 2008/0283942 | A1 | 11/2008 | Huang et al. |
| 2009/0001553 | A1 | 1/2009 | Pahl et al. |
| 2009/0180655 | A1 | 7/2009 | Tien et al. |
| 2010/0046780 | A1 * | 2/2010 | Song ..................... H04R 19/016 381/361 |
| 2010/0052082 | A1 | 3/2010 | Lee et al. |
| 2010/0128914 | A1 | 5/2010 | Khenkin |
| 2010/0183181 | A1 | 7/2010 | Wang |
| 2010/0246877 | A1 | 9/2010 | Wang et al. |
| 2010/0290644 | A1 | 11/2010 | Wu et al. |
| 2010/0322443 | A1 | 12/2010 | Wu et al. |
| 2010/0322451 | A1 | 12/2010 | Wu et al. |
| 2011/0013787 | A1 | 1/2011 | Chang |
| 2011/0075875 | A1 | 3/2011 | Wu et al. |
| 2012/0146163 | A1 * | 6/2012 | Ho ...................... B81C 1/00309 257/416 |
| 2012/0148083 | A1 * | 6/2012 | Knauss ................. H04R 19/04 381/361 |
| 2014/0044297 | A1 * | 2/2014 | Loeppert ............... H04R 1/086 381/355 |
| 2014/0169607 | A1 * | 6/2014 | Goida ................... H04R 1/021 381/365 |
| 2016/0075552 | A1 * | 3/2016 | Pahl ...................... B81B 7/007 257/416 |
| 2016/0261941 | A1 * | 9/2016 | Brioschi ................ H04R 1/086 |
| 2017/0048625 | A1 * | 2/2017 | Salmon .................. B81B 3/00 |
| 2018/0146296 | A1 * | 5/2018 | Meisel ................. H04R 19/005 |

* cited by examiner

ELEVATED MEMS DEVICE IN A MICROPHONE WITH INGRESS PROTECTION

CROSS-REFERENCE TO RELATED APPLICATIONS

This application claims the benefit of and priority to U.S. Provisional Patent Application No. 62/561,653, filed Sep. 21, 2017, the entire contents of which are incorporated herein by reference.

TECHNICAL FIELD

This application relates to micro electro mechanical system (MEMS) microphones and, more specifically, to ingress protection for these devices.

BACKGROUND OF THE INVENTION

Different types of acoustic devices have been used through the years. One type of device is a microphone. In a microelectromechanical system (MEMS) microphone, a MEMS die includes at least one diaphragm and at least one back plate. The MEMS die is supported by a substrate and enclosed by a housing (e.g., a cup or cover with walls). A port may extend through the substrate (for a bottom port device) or through the top of the housing (for a top port device). In any case, sound energy traverses through the port, moves the diaphragm and creates a changing potential of the back plate, which creates an electrical signal. Microphones are deployed in various types of devices such as personal computers or cellular phones.

When operating in different environments, various types of contaminants can infiltrate into the interior of the microphone. For example, water or dirt may infiltrate the interior of the microphone. This is undesirable because the contaminants can damage the components of the microphone. Damage to the components causes performance problems or can cause the microphone to cease to operate.

Various approaches have been attempted to prevent contaminant ingress into microphones. Unfortunately, many of these approaches themselves degrade the performance of the microphone, for example, by introducing unacceptable levels of noise and decreasing the signal-to-noise ratio (SNR).

The problems of previous approaches have resulted in some user dissatisfaction with these previous approaches.

BRIEF DESCRIPTION OF THE DRAWINGS

For a more complete understanding of the disclosure, reference should be made to the following detailed description and accompanying drawings wherein.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide microphones with ingress protection from contaminants that might damage or destroy the microphone and/or its components. The approaches prevent contaminants from entering the interior of the microphone but do not substantially degrade the performance of the microphone. As a result, better SNRs are provided. Additionally, the approaches described herein are portable in that they can easily be applied to current microphones without having to re-work the configuration of the existing microphone.

Referring now to FIG. 1, FIG. 2, FIG. 3, FIG. 4 and FIG. 5, one example of a MEMS microphone 100 with ingress protection is described. The microphone 100 includes a base 102, a MEMS device 104 (e.g., a MEMS transducer, such as an acoustic transducer) (including two MEMS motors, each including a diaphragm 103 and a back plate 105), an application specific integrated circuit 108, a shim assembly 110, an ingress protection element 112, ports 114 that extend through the base 102, and a lid 116. Although dual MEMS motors are described in the examples herein, it will be appreciated that the present approaches apply to any number of MEMS motors and ports.

The base 102 may be a printed circuit board (PCB) in one example. Other examples are possible.

The MEMS device 104 converts sound energy received through the port into an electrical signal representative of the sound energy. As mentioned, the MEMS device 104 in this example is a dual MEMS motor with a first diaphragm and a first back plate, and a second diaphragm and a second back plate. In operation, sound energy moves the diaphragms 103 and creates a changing electrical potential with the back plates 105, which in turn creates separate electrical currents, which are sent to the ASIC 108 via wires 107. The ASIC 108 further processes the signal, for example, performing noise removal functions.

The shim assembly 110 may be constructed of an epoxy, includes four walls 120, and forms a volume or cavity 115. The volume or cavity 115 is part of the front volume 117 of the microphone 100. The front volume 117 includes volume 115 and a volume 119 of the back hole formed by the MEMS device 104. The front volume 117 is divided by the ingress protection element 112. In some aspects, the front volume 117 may also include the volume of the port 114. The back volume 121 of the microphone 100 is bounded by the lid 116, MEMS device 104, base 102, and ASIC 108.

Figure 4:
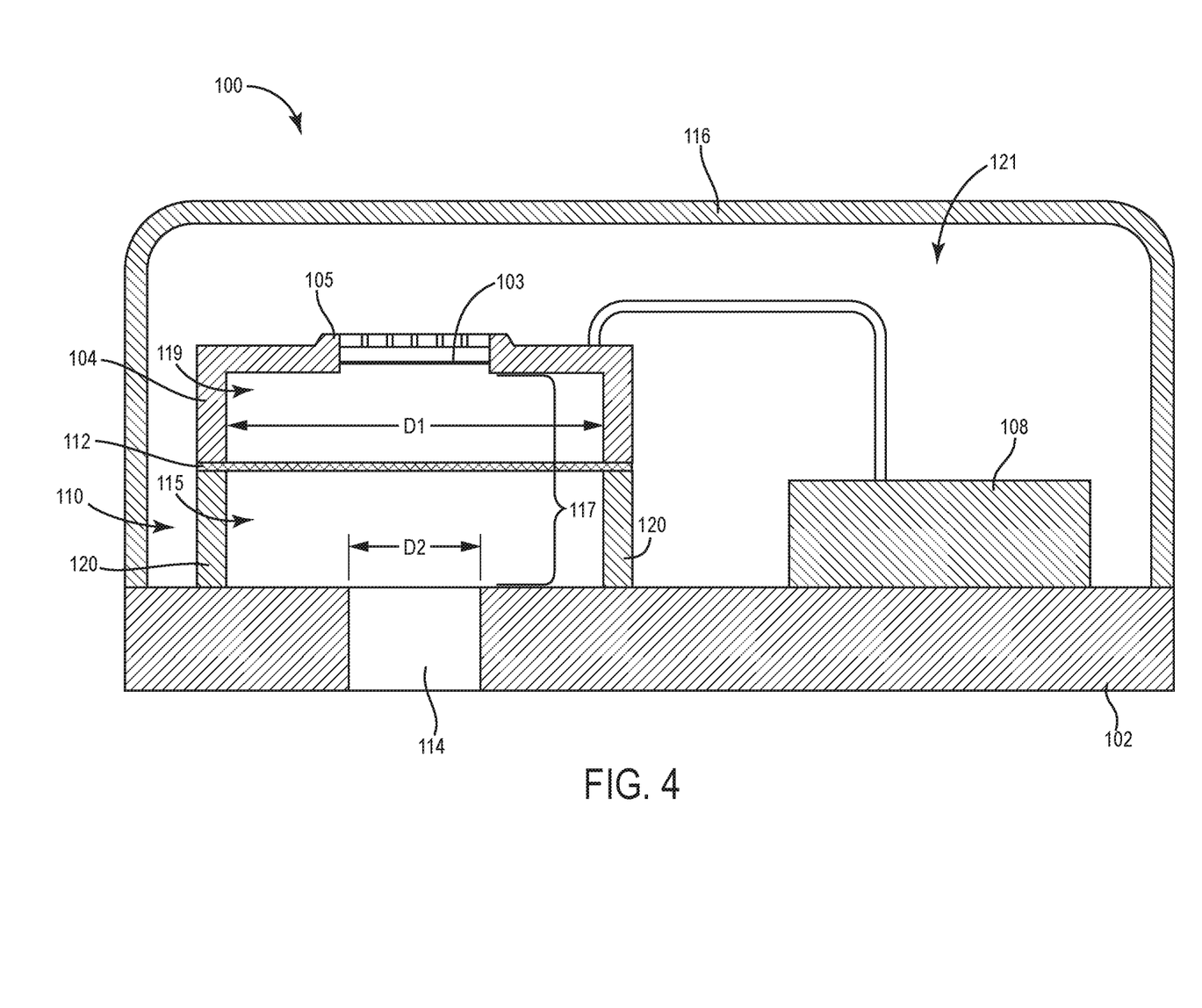
FIG. 4 is a side cutaway view of the microphone of FIG. 1, FIG. 2, and FIG. 3.
Figure 5:
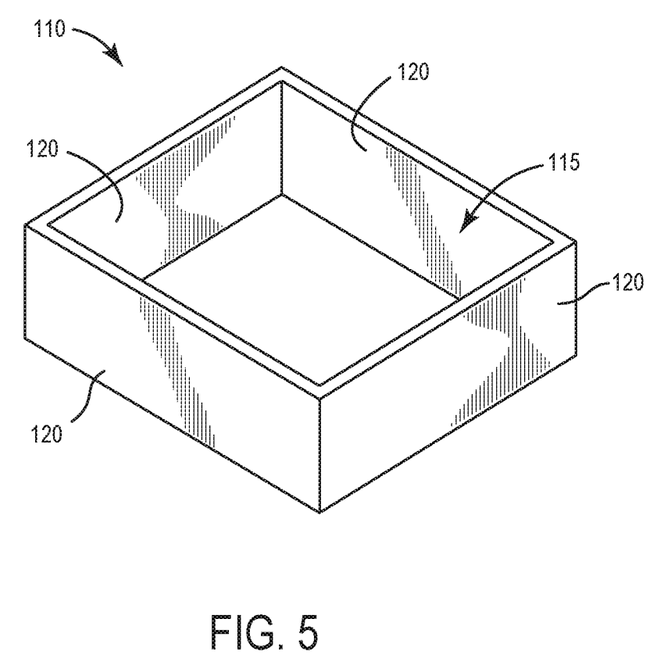
FIG. 5 is a perspective view of a shim assembly, according to an example embodiment.

The ingress protection element 112 may be a mesh screen in one example. More specifically, the screen may be constructed of a film (e.g., constructed of polyamide) and includes multiple openings (or holes) through the film and through which sound passes. However, the openings are small enough that selected solid, liquid, or gaseous contaminants cannot pass.

In one example, the ingress protection element 112 (e.g., a mesh screen) extends under the MEMS device 104 with a length D1 that is greater than the diameter D2 of the port hole 114. The area of the ingress protection element 112 (e.g., a mesh screen) is also greater than the area of the port hole 114. Other examples of ingress protection elements besides screens are possible.

The ingress protection element 112 (e.g., a mesh screen) is placed on top of a hollow shim assembly, then the MEMS device 104 is placed on top of the ingress protection element 112 (e.g., mesh screen). The effect is in one example a mesh screen being positioned in the middle of the front volume 117 of the MEMS cavity, with the mesh screen dividing the front volume 117. The combined structure of the MEMS device 104, ingress protection element 112, and shim assembly 110 is acoustically sealed. That is, there is no acoustic leakage between the connection points or areas of these elements.

The equivalent acoustic resistance of the ingress protection element 112 of the microphone 100 depends on a variety of factors. Assuming the ingress protection element is a mesh screen, the equivalent resistance in part depends upon the size of the mesh screen and area of the acoustic opening (which is now larger than the port). The impedance for one opening (or hole) in the mesh screen is:

$$Z_a = R_a - j\omega\, M_a$$

$$\text{Where: } R_a = \rho_0 \pi r^2 \sqrt{2\omega\mu}\left[\frac{t}{r} + 2\left(1 - \frac{A_h}{A_b}\right)\right]$$

$$\text{And: } M_a = \frac{\rho_0}{\pi r^2}\left[t + 1.7r\left(1 - \frac{r}{b}\right)\right]$$

Where: $\rho_0$ is the density of air, r is the opening radius, b is the distance between holes, t is the thickness of mesh, $A_h$ is the area of the opening, and $A_b$ is the area of non-opening per hole cell.

Figure 12:
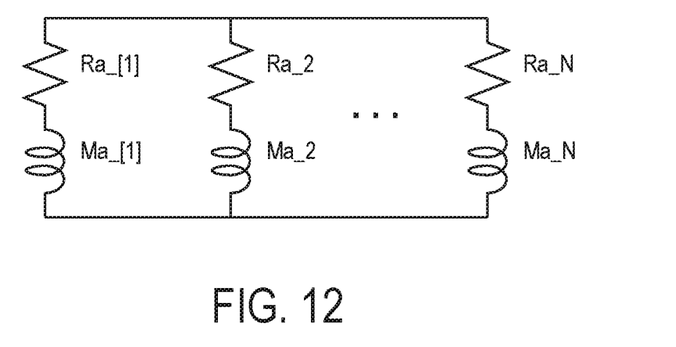
FIG. 12 is a circuit diagram showing acoustic impedance pathways modeled as an electric circuit, according to an example embodiment.

The equations above describe one acoustic impedance pathway modeled as an RL series circuit. Noise from the mesh screen is dominated by the lossy resistance pathway ($R_a$). The total acoustic impedance of the mesh is the sum of all pathways and can be visualized as the equivalent circuit shown in FIG. 12. Each $R_a$ and $M_a$ element in this figure represents an acoustic impedance pathway.

Figure 13:
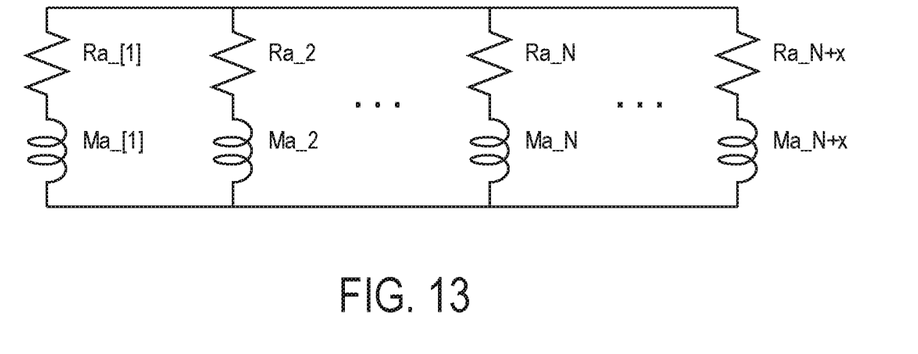
FIG. 13 is a circuit diagram showing acoustic impedance pathways modeled as an electric circuit with an increased number of pathways, according to an example embodiment.

The more RL networks that are in parallel, the lower the total effective impedance. A mesh screen disposed directly over the porthole limits the number of pathways by the size of the porthole. As the opening (back hole) of the MEMS device is always larger than the porthole, more mesh can be fitted, and more pathways created. The effect of increasing the number of pathways is to reduce the total noise introduced by the mesh. This can be seen from the equivalent circuit of FIG. 13 where $R_{a\_N+x}$ represents the increased number of pathways achieved by placing the screen under the MEMS and not in the port hole. It will be appreciated that by increasing the number of passageways, the impedance (and hence noise) introduced by the mesh screen is lowered to acceptable levels.

Referring now to FIGS. 6-11, one example of an assembly or manufacturing process is described.

Figure 6:
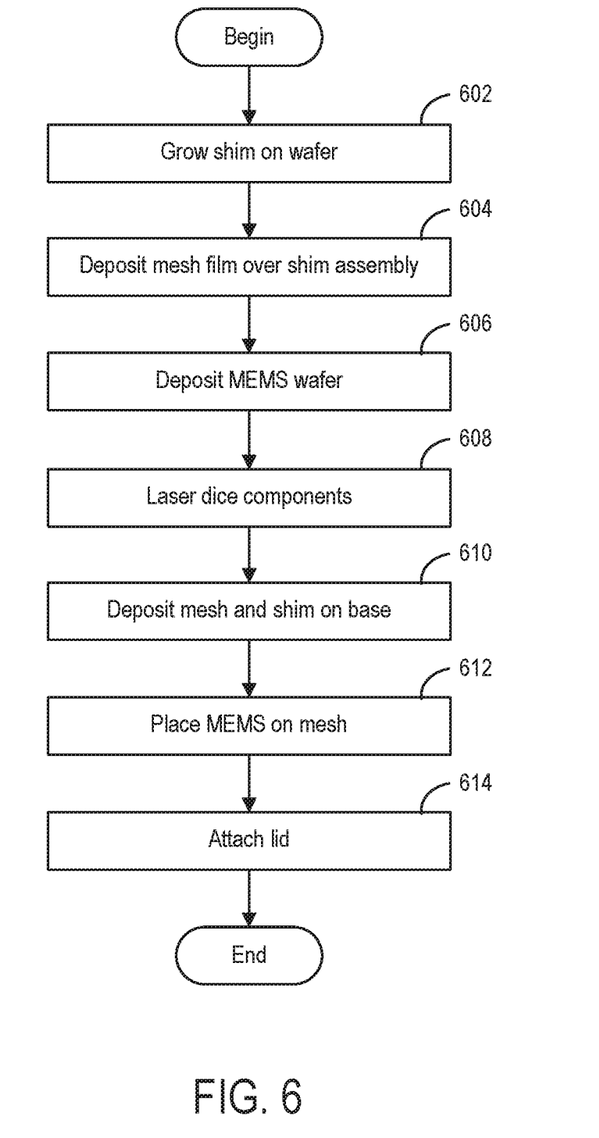
FIG. 6 is a flowchart of a process for manufacturing a MEMS microphone with ingress protection, according to an example embodiment.
Figure 7:
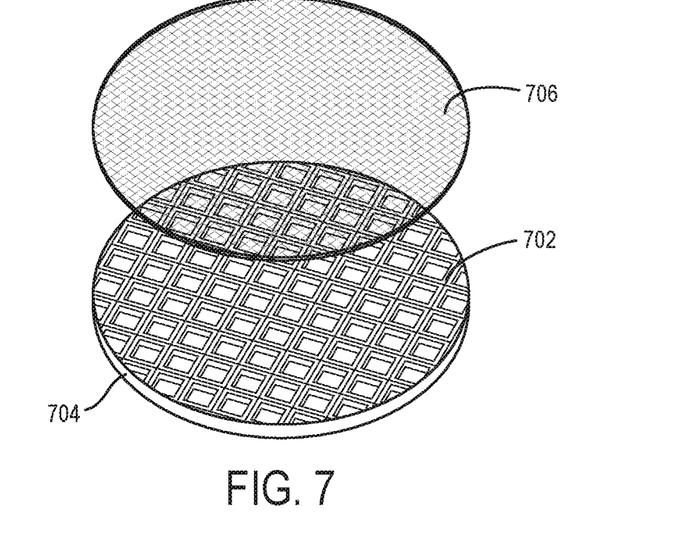
FIG. 7 is a perspective diagram of manufacturing portions of a microphone, according to an example embodiment.

At step 602, the elements that will include the shim assembly are grown, deposited, or otherwise assembled as a wafer. As shown in FIG. 7, materials that will become a shim assembly are grown as a shim assembly wafer 704. The wafer 704 includes various individual components 702, and each of these components will become an individual shim assembly.

Figure 8:
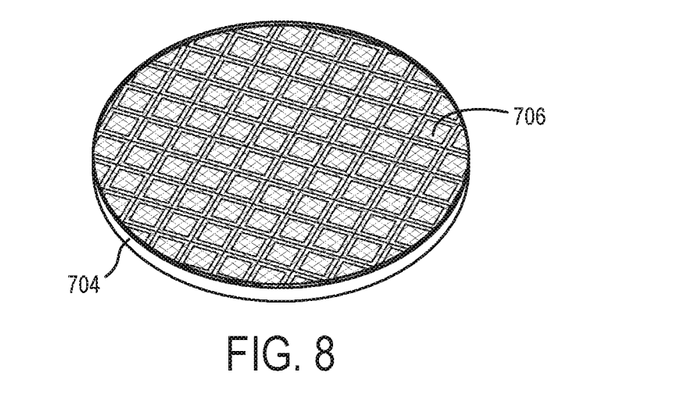
FIG. 8 is another perspective diagram of manufacturing portions of a microphone, according to an example embodiment.

At step 604, the mesh film is deposited over the shim assembly wafer. As shown in FIG. 7 and FIG. 8, mesh film 706 is deposited on the wafer 704.

Figure 9:
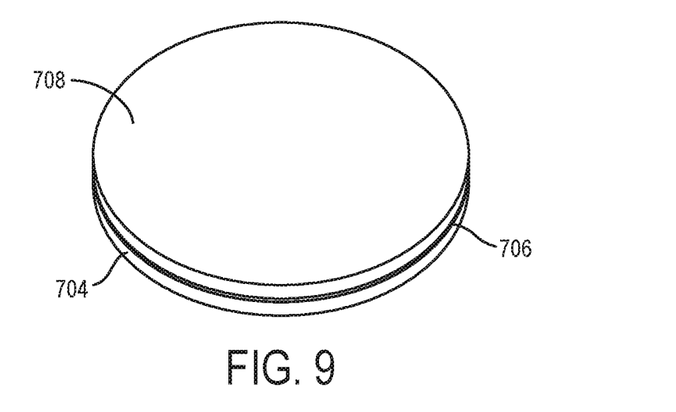
FIG. 9 is another perspective diagram of manufacturing portions of a microphone, according to an example embodiment.

At step 606 and as shown in FIG. 9, a MEMS wafer 708 is disposed over the mesh film 706 and shim assembly wafer 704. As with the shim assembly wafer 704, the MEMS wafer will be divided into individual MEMS devices. Each of these MEMS devices corresponds to one shim assembly (from the shim assembly wafer 704).

Figure 1:
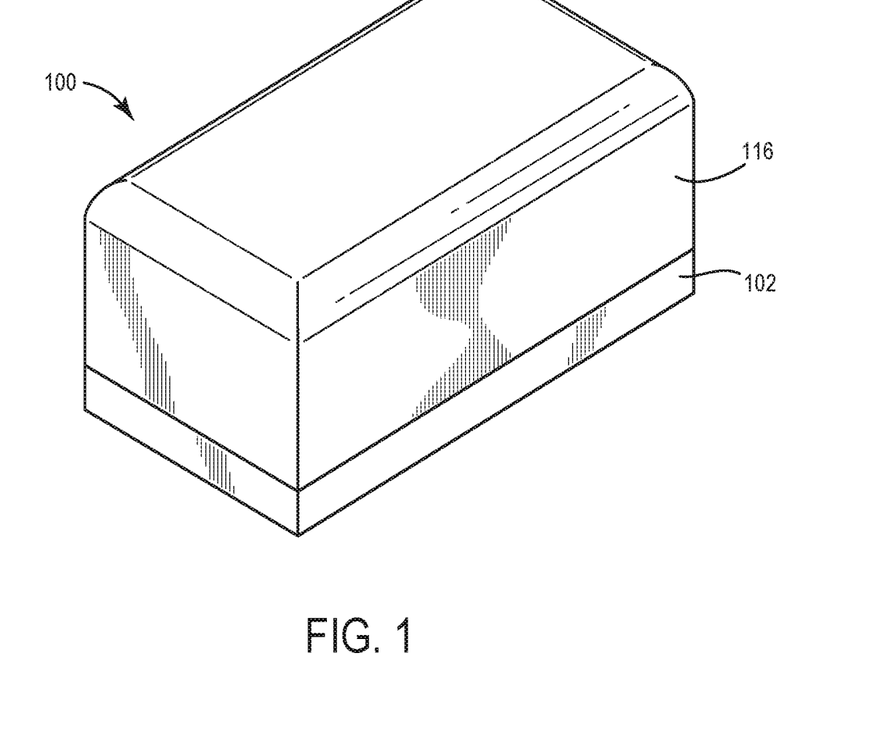
FIG. 1 is a perspective view of a microphone exterior, according to an example embodiment.
Figure 2:
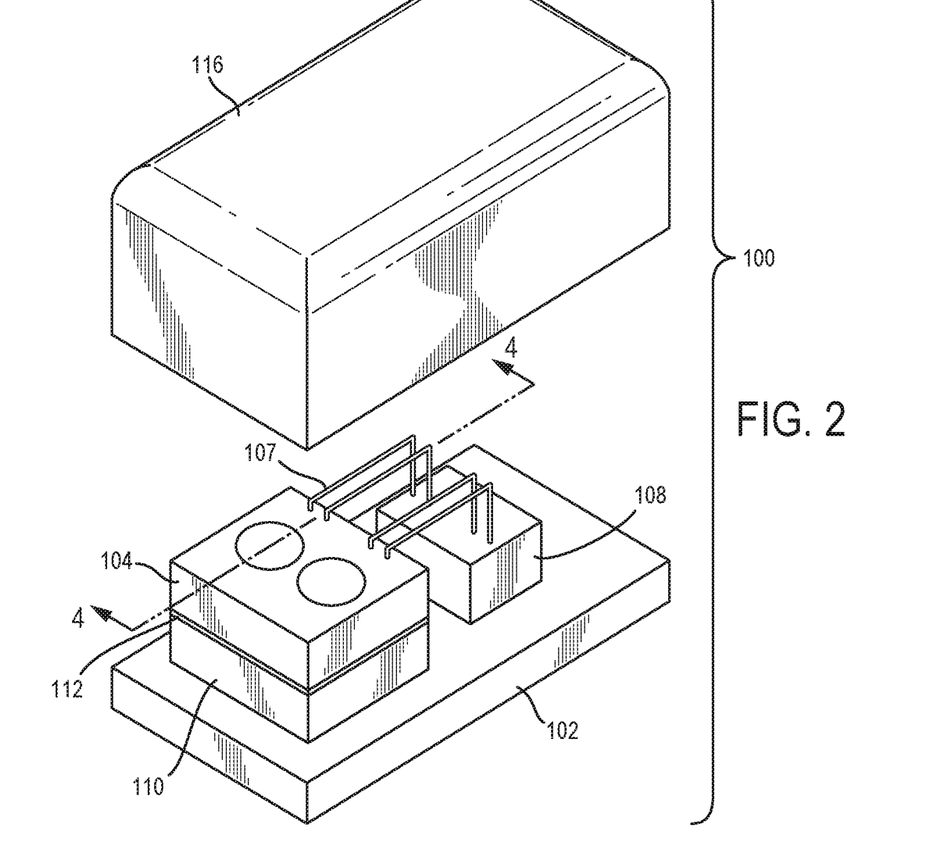
FIG. 2 is a perspective view of the interior of the microphone of FIG. 1.
Figure 3:
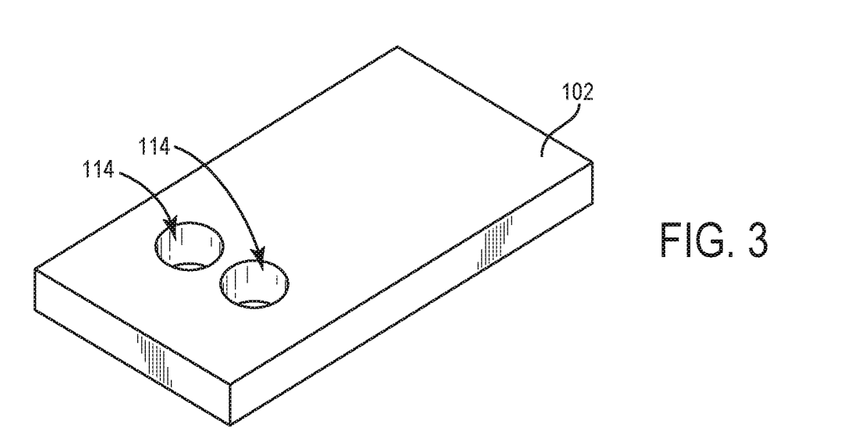
FIG. 3 is a bottom perspective view of the microphone of FIG. 1 and FIG. 2.
Figure 10:
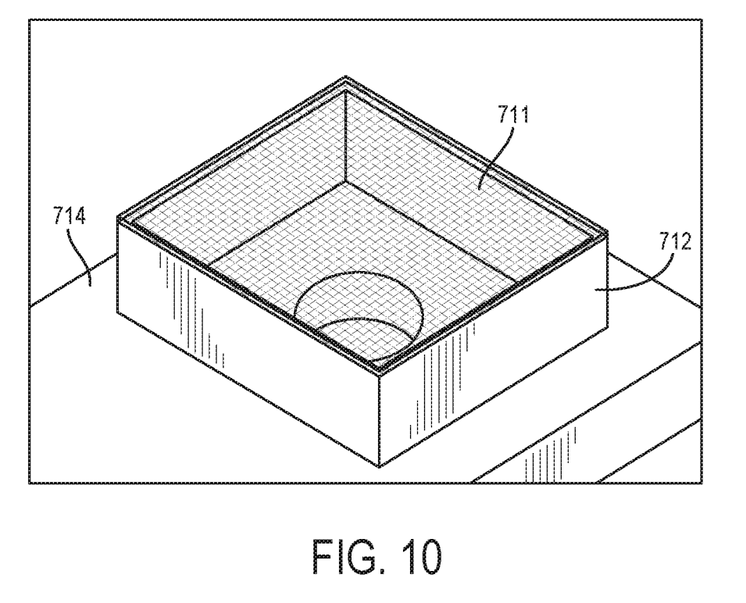
FIG. 10 is another perspective diagram of manufacturing portions of a microphone, according to an example embodiment.

At step 608, a laser is used to dice (cut) through the assembly. As shown in FIG. 10 and FIG. 1, a particular MEMS device 710 is cut out and shaped as needed. A particular shim assembly 712 (e.g., shim assembly 110 of FIG. 1) is also cut from the shim assembly wafer 704 to form the shim assembly 712. The MEMS device 710 may be removed and diaphragms and back plates added to complete the MEMS device 710. The mesh 706 is cut to form mesh portion 711 that matches the dimensions of the shim assembly 712.

Figure 11:
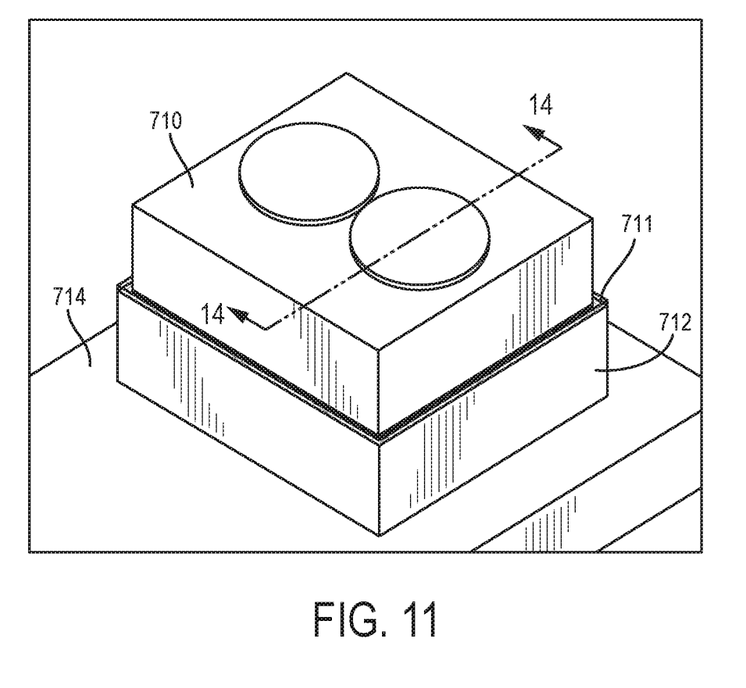
FIG. 11 is another perspective diagram of manufacturing portions of a microphone, according to an example embodiment.

At step 610, the mesh portion 711 and shim assembly 712 are deposited onto the base 714.

At step 612, the MEMS device 710 is deposited onto the mesh portion 711. An acoustic seal may be formed to ensure no leakage occurs from the front volume to the back volume of the microphone.

At step 614, microphone assembly is completed by attaching the lid (not shown) to the base 714. An acoustic seal may also be created between the lid and the base 714 to ensure no leakage between the interior of the microphone and the exterior of the microphone.

Figure 14:
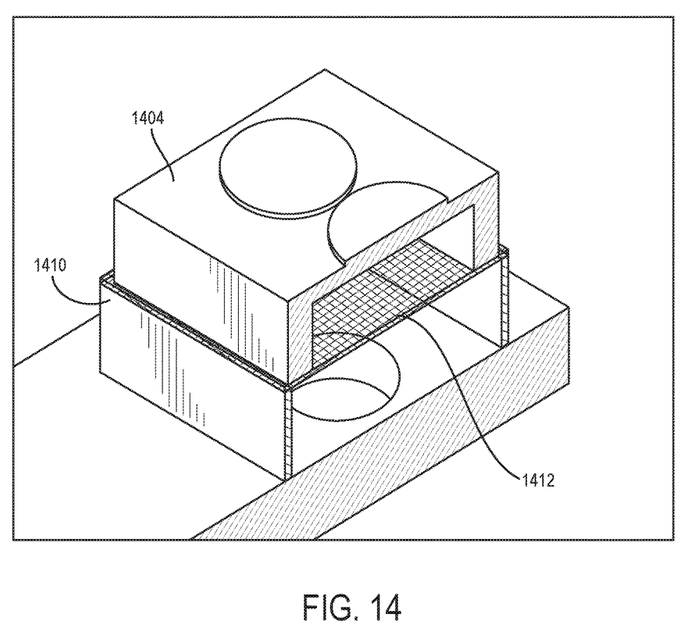
FIG. 14 is a perspective diagram of a MEMS device, a shim assembly, and an ingress protection element, according to an example embodiment.

Referring now to FIG. 14, another example of a shim assembly, mesh, and MEMS device combination is described.

In this example, a MEMS device 1404 includes dual MEMS motors. The MEMS device 1404 is disposed on top of mesh screen 1412, and mesh screen 1412 is disposed on top of a shim assembly 1410. This example is similar to the example of FIG. 1-FIG. 5, except that the outer surface of the MEMS device 104 is not flush with the outer surface of the mesh screen 1412 and the outer surface of the shim assembly 1410. Instead, the width and length of the MEMS device 1404 is less than that of the mesh screen 1412 and shim assembly 1410 creating a stepped configuration.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A micro electro mechanical system (MEMS) microphone comprising:
    a base including a port extending through the base;
    a shim assembly disposed on the base and over the port, the shim assembly having a plurality of walls that form a hollow interior cavity, the shim assembly having a top surface and a bottom surface, the bottom surface being coupled to the base;
    an ingress protection element extending over and coupled to the top surface of the shim assembly, wherein the shim assembly elevates the ingress protection element above the base, the ingress protection element being effective to prevent the passage of contaminants there through; and
    a MEMS device including a diaphragm and a back plate, the MEMS device being disposed over the ingress protection element, wherein an exposed length of the ingress protection element underneath the MEMS device is greater than a diameter of the port.

2. The MEMS microphone of claim 1, wherein a combined structure of the shim assembly, the ingress protection element, and the MEMS device forms an acoustic seal.

3. The MEMS microphone of claim 1, wherein the shim assembly is constructed of an epoxy material and the plurality of walls comprises four walls.

4. The MEMS microphone of claim 1, wherein the ingress protection element is a screen.

5. The MEMS microphone of claim 4, wherein the screen is constructed of a mesh material and includes a number of openings.

6. The MEMS microphone of claim 1, wherein the ingress protection element has an area greater than that of the port.

7. The MEMS microphone of claim 1, further comprising an application specific integrated circuit (ASIC) disposed on the base.

8. The MEMS microphone of claim 1, wherein the MEMS device further comprises a second diaphragm and a second back plate.

9. The MEMS microphone of claim 8, wherein the base includes a plurality of ports extending through the base, and wherein the ingress protection element has an area greater than a combined area of the plurality of ports.

10. A micro electro mechanical system (MEMS) device assembly comprising:
    a shim assembly having a plurality of walls that form a hollow interior cavity, the shim assembly having a top surface and a bottom surface;
    an ingress protection element having a top surface and a bottom surface, the bottom surface of the ingress protection element extending over and coupled to the top surface of the shim assembly, wherein the shim assembly elevates the ingress protection element above the bottom surface of the shim assembly, the ingress protection element being effective to prevent the passage of contaminants there through; and
    a MEMS device including a diaphragm and a back plate, the MEMS device being disposed over and coupled to the top surface of the ingress protection element.

11. The MEMS device assembly of claim 10, wherein the shim assembly is constructed of an epoxy material and the plurality of walls comprises four walls.

12. The MEMS device assembly of claim 10, wherein the ingress protection element is a screen.

13. The MEMS device assembly of claim 12, wherein the screen is constructed of a mesh material and includes a number of openings.

14. The MEMS device assembly of claim 10, wherein the MEMS device further comprises a second diaphragm and a second back plate.

15. A method of manufacturing a micro electro mechanical system (MEMS) microphone comprising:
    growing a shim assembly on a first wafer, the shim assembly comprising a plurality of walls that form a hollow interior cavity;
    depositing an ingress protection element over the first wafer, the ingress protection element being effective to prevent the passage of contaminants there through;
    depositing a second wafer over the ingress protection element, wherein the second wafer is a MEMS wafer;
    dicing the first wafer, ingress protection element, and MEMS wafer to form a MEMS device, the MEMS device including a diaphragm and a back plate;
    depositing the shim assembly on a base of the microphone;
    depositing the ingress protection element on top of the shim assembly;
    depositing the MEMS device directly on top of the ingress protection element; and
    coupling a lid to the base, thereby encapsulating the shim assembly, ingress protection element, and MEMS device.

16. The method of claim 15, wherein a combined structure of the shim assembly, the ingress protection element, and the MEMS device forms an acoustic seal.

17. The method of claim 15, wherein the shim assembly is constructed of an epoxy material and the plurality of walls comprises four walls.

18. The method of claim 15, wherein the ingress protection element is a screen.

19. The method of claim 18, wherein the screen is constructed of a mesh material and includes a number of openings.

20. The method of claim 15, wherein the ingress protection element has an area greater than that of the port.

* * * * *